United States Patent [19]

Lee et al.

[11] Patent Number: 4,778,950
[45] Date of Patent: Oct. 18, 1988

[54] ANISOTROPIC ELASTOMERIC INTERCONNECTING SYSTEM

[75] Inventors: James C. K. Lee, Los Altos Hills; Richard Beck, Cupertino; Chune Lee, San Francisco; Edward Hu, Sunnyvale, all of Calif.

[73] Assignee: Digital Equipment Corporation, Maynard, Mass.

[21] Appl. No.: 853,313

[22] Filed: Apr. 17, 1986

Related U.S. Application Data

[63] Continuation-in-part of Ser. No. 757,600, Jul. 22, 1985, Pat. No. 4,729,166.

[51] Int. Cl.⁴ .............................................. H01B 7/00
[52] U.S. Cl. ................................. 174/356 C; 29/25.42
[58] Field of Search ................. 29/825, 868, 876, 877, 29/878, 25.42; 339/17, 59–61, DIG. 3; 174/356 C

[56] References Cited

U.S. PATENT DOCUMENTS

| | | | |
|---|---|---|---|
| 3,574,022 | 4/1971 | Lampert | 156/307.7 X |
| 3,862,790 | 1/1975 | Davies et al. | 339/17 |
| 3,982,320 | 9/1976 | Buchoff et al. | 29/630 |
| 4,003,621 | 1/1977 | Lamp | 339/59 |
| 4,199,637 | 4/1980 | Sado | 428/119 |
| 4,210,895 | 7/1980 | Sado et al. | 338/99 |
| 4,252,391 | 2/1981 | Sado | 339/60 |
| 4,252,990 | 2/1981 | Sado | 174/52 |
| 4,295,700 | 10/1981 | Sado | 339/61 |
| 4,330,165 | 5/1982 | Sado | 339/59 |
| 4,449,774 | 5/1984 | Takashi et al. | 339/59 |
| 4,520,562 | 6/1985 | Sado et al. | 29/878 |
| 4,612,689 | 9/1986 | de Wild et al. | 29/25.42 |

OTHER PUBLICATIONS

Buchoff, (1980), "Elastomeric Connections . . . ", Microele. Mfg., Oct.
Buchoff, (1983), "Surface Mounting . . . ", Electronics, Jun.

Primary Examiner—Timothy V. Eley
Attorney, Agent, or Firm—Nutter, McClennen & Fish

[57] ABSTRACT

Electronic assemblies are fabricated by stacking alternate connecting layers and component layers. The component layers may be virtually any rigid structure having contact regions formed on at least one face thereof. The connecting layers are formed from anisotropic elastomeric conductors which in turn are fabricated by stacking a plurality of conductive sheets and insulating sheets, where the conductive sheets have a plurality of parallel electrically conductive elements formed therein. By introducing a curable elastomeric resin into the stacked structure so formed, and then curing the elastomer, a solid elastomeric block having a plurality of parallel electrically conductive elements running its length is obtained. Individual elastomeric conductors suitable as connecting layers interfacing between adjacent component layers are obtained by slicing the block in a direction perpendicular to the conductors.

13 Claims, 5 Drawing Sheets

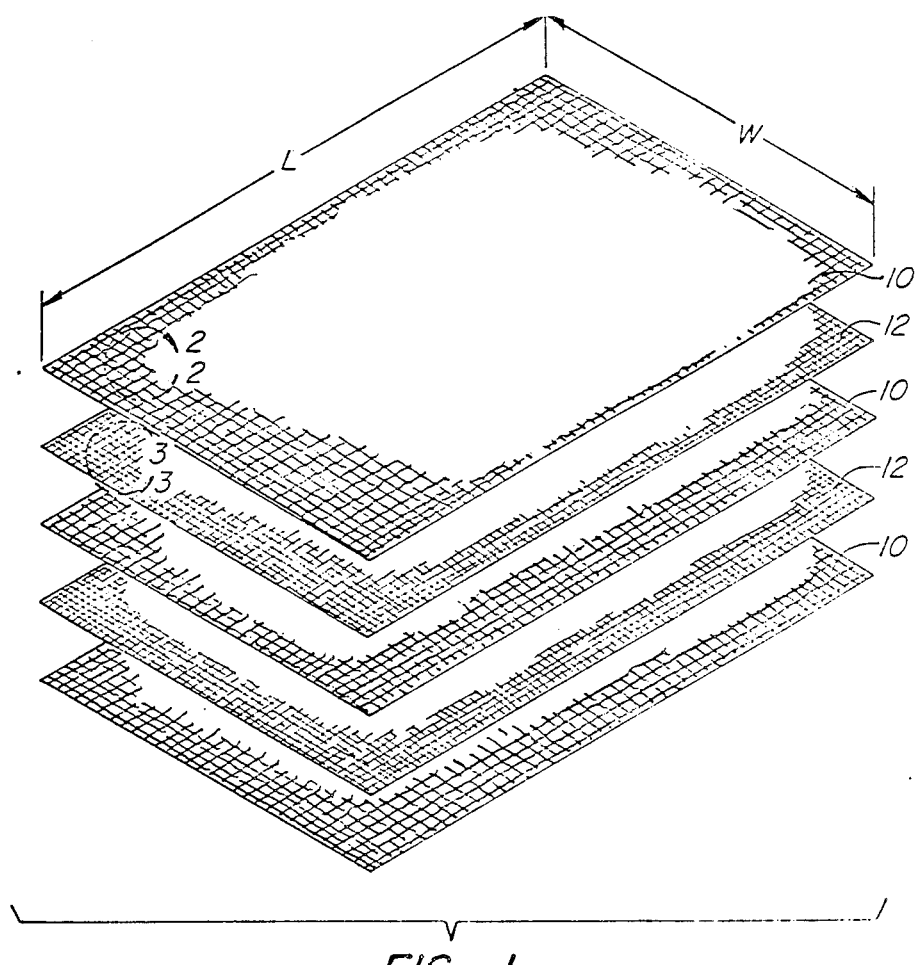
FIG._1.
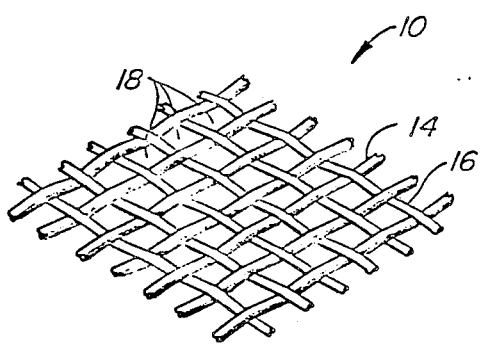
FIG._2.
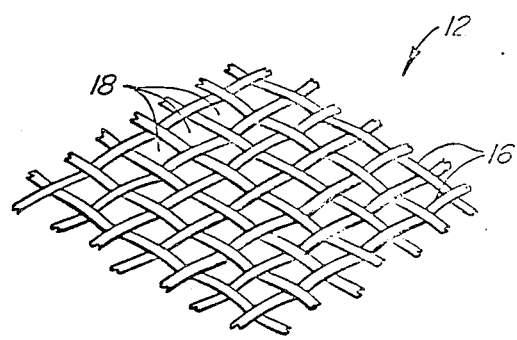
FIG._3.

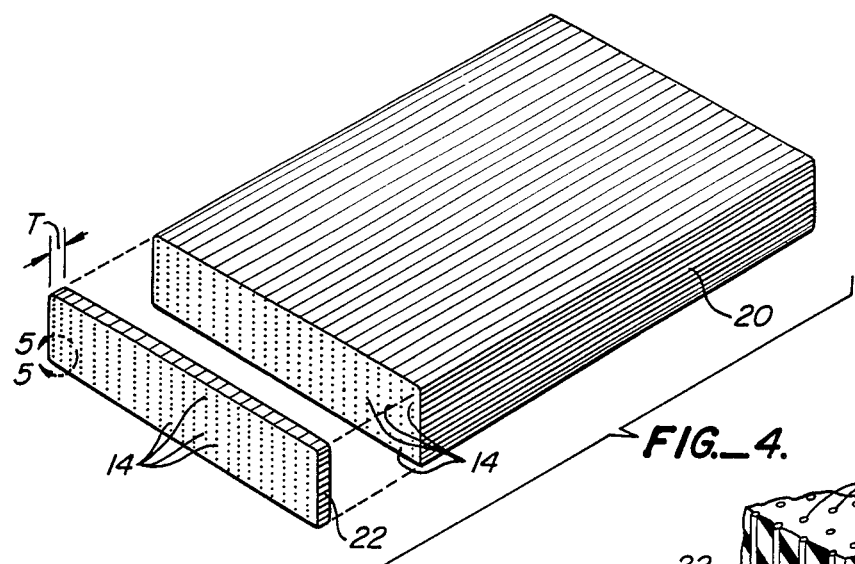
FIG._4.
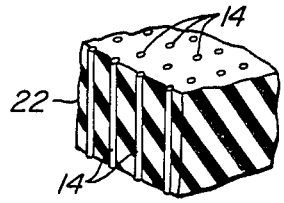
FIG._5.
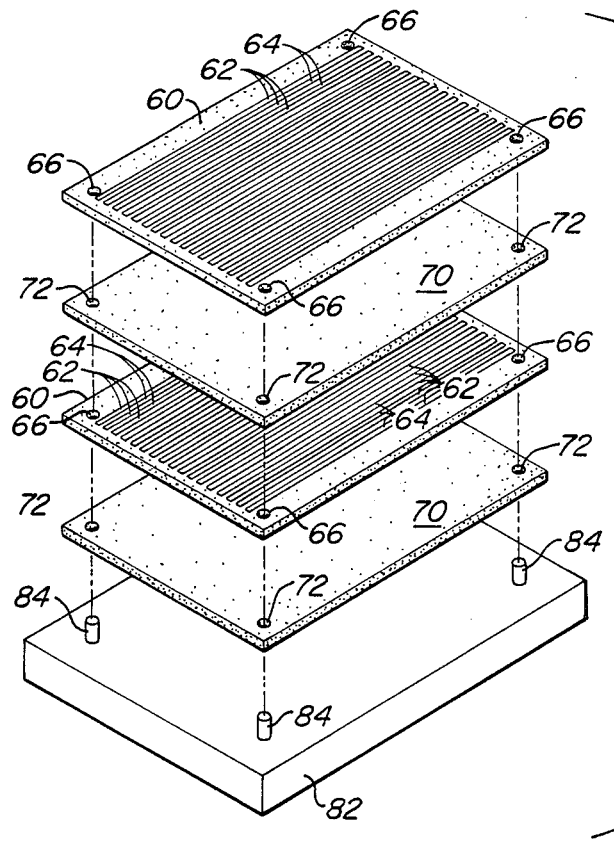
FIG._6.

FIG._7.
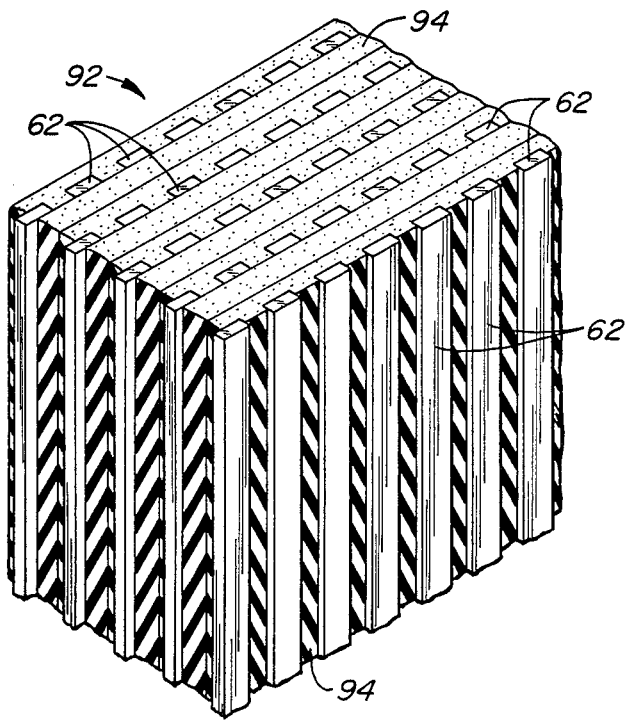
FIG._8.

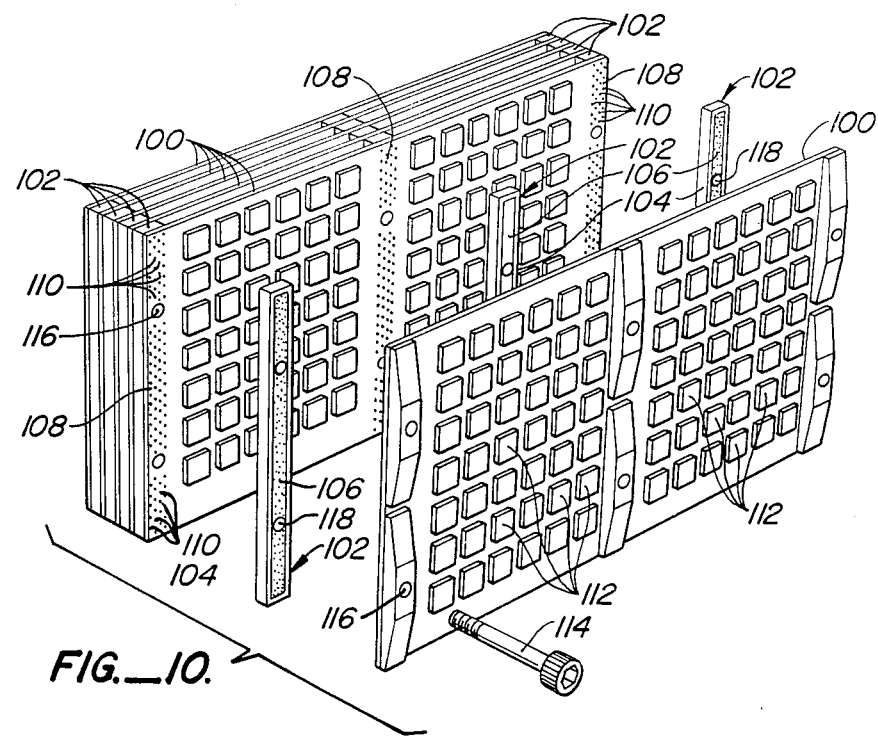
FIG._10.
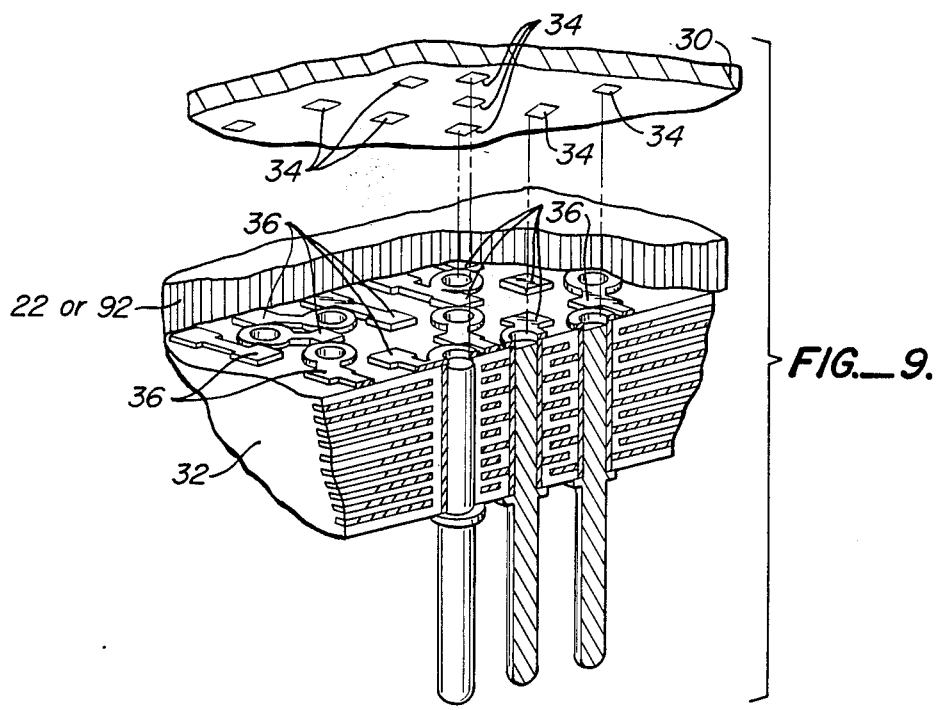
FIG._9.

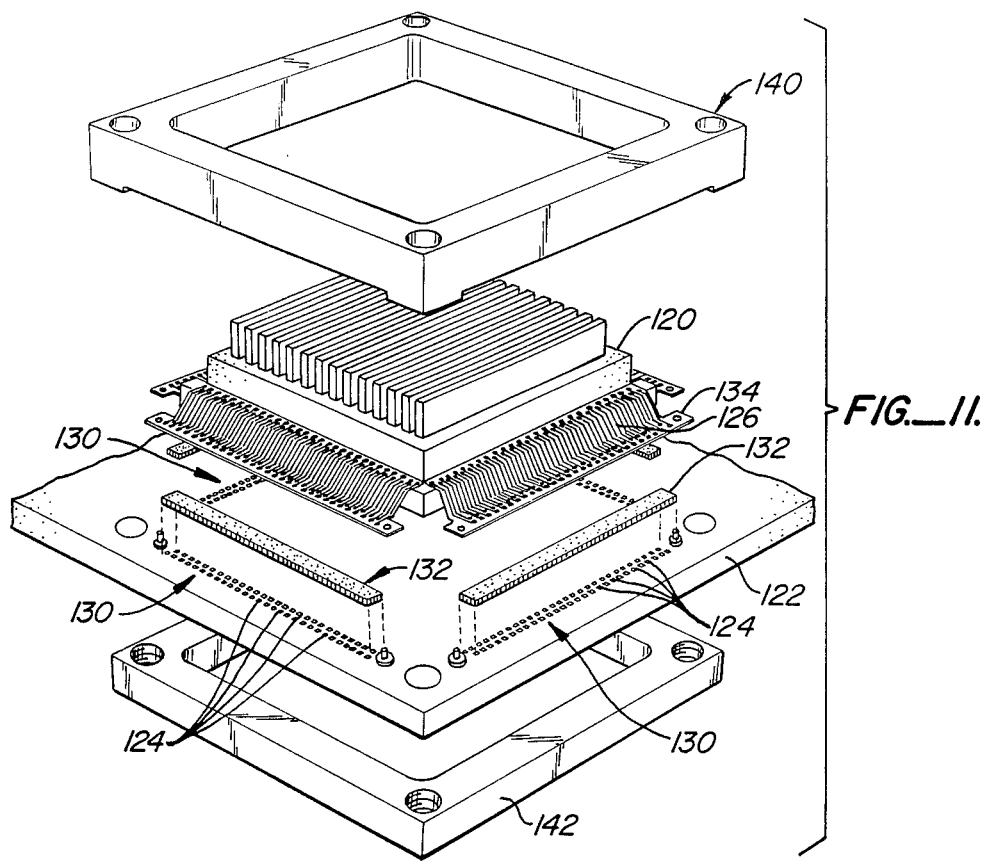
FIG._11.
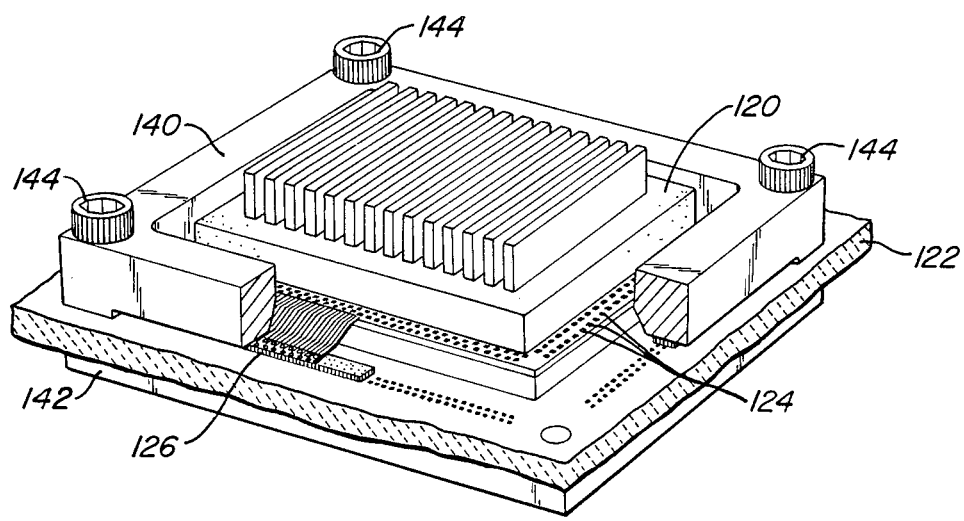
FIG._12.

ANISOTROPIC ELASTOMERIC INTERCONNECTING SYSTEM

This application is a continuation-in-part of application Ser. No. 757,600 filed on July 22, 1985 now U.S. Pat. No. 4,729,166.

BACKGROUND OF THE INVENTION

1. Field of the Invention

The present invention relates generally to articles and methods for electrically connecting electronic devices. More particularly, the invention relates to improved methods for fabricating electronic assemblies which rely on electrical interfaces between adjacent component layers.

Over the past ten years, electrically conductive elastomers have found increasing use as interface connectors between electronic devices, serving as an alterntive for traditional solder connections and socket connections. Elastomeric conductors can take a variety of forms, but generally must provide for anisotropic electrical conduction. Anisotropic conduction means that the electrical resistance measured in one direction through the material will differ from that measured in another direction. Generally, the elstomeric conductors of the prior art have been materials which provide for high resistance in at least one of the orthogonal directions of the material, while providing low resistance in the remaining one or two directions. In this way, a single piece or sheet of material can provide for multiple connections so long as the connector terminals on the devices to be connected are properly aligned.

2. Description of the Prior Art

The anisotropic elastomeric conductors of the prior art generally consist of an electrically conductive material dispersed or arranged in an electrically insulating material. In one form, alternate sheets of conductive and non-conductive materials are layered to form a block, and individual connector pieces can be cut from the block in a direction perpendicular to the interface of the layers. Connector pieces embodying such layered connectors have been sold under the trade name "Zebra" by Tecknit, Cranford, N.J., and the trade name "Stax" by PCK Elastomerics, Inc., Hatboro, Pa. Such connectors are discussed generally in Buchoff, "Surface Mounting of Components will Elastomeric Connectors," Electri-Onics, June, 1983; Buchoff, "Elastomeric Connections for Test & Burn-In," Microelectronics Manufacturing and Testing, October, 1980; Anon., "Conductive Elastomeric Connectors Offer New Packaging Design Potential for Single Contacts or Complete Connection Systems," Insulation/Circuits, February, 1975; and Anon., "Conductive Elastomers Make Bid to Make Over Interconnections," Product Engineering, December 1974. While useful under a number of circumstances, such layered anisotropic elastomeric conductors provide electrical conductivity in two orthogonal directions, providing insulation only in the third orthogonal direction. Thus, the layered anisotropic elastomeric conductors are unsuitable for providing surface interface connections where a two-dimensional array of connector terminals on one surface is to be connected to a similar two-dimensional array of connectors on a second surface. Such a situation requires anisotropic elastomeric conductor which provides for conductivity in one direction only.

At least two manufacturers provide anisotropic elastomeric conductors which allow for conduction in one direction only. Tecknit, Cranford, NJ, manufactures a line of connectors under the trade name "Conmet." The Conmet connectors comprise elastomeric elements having two parallel rows of electrically conductive wires embedded therein. The wires are all parallel, and electrical connections may be made by sandwiching the connector between two surfaces so that good contact is established. The Conmet connector is for connecting circuit boards together, as well as connecting chip carriers and the like to printed circuit boards. The matrix is silicone rubber.

A second anisotropic elastomeric conductor which conducts in one direction only is manufactured by Shin-Etsu Polymer Company, Ltd., Japan, and described in U.S. Pat. Nos. 4,252,391; 4,252,990; 4,210,895; and 4,199,637. Referring in particular to U.S. Pat. No. 4,252,391, a pressure-sensitive electroconductive composite sheet is prepared by dispersing a plurality of electrically conductive fibers into an elastomeric matrix, such as silicone rubber. The combination of the rubber matrix and the conductive fibers are mixed under sheer conditions which break the fibers into lengths generally between 20 to 80% of the thickness of the sheet which is to be prepared. The fibers are then aligned parallel to one another by subjecting the mixture to a sheer deformation event, such as pumping or extruding. The composite mixture is then hardened, and sheets prepared by slicing from the hardened structure. The electrically conductive fibers do not extend the entire thickness of the resulting sheets, and electrical contact is made through the sheet only by applying pressure.

U.S. Pat. Nos. 3,862,790 and 4,003,621 disclose the use of resilient interconnector pads having parallel conductors therein for interconnecting opposed planar arrays of contact pads, e.g., connecting adjacent insulator boards having contact pads thereon.

Although useful, the anisotropic elastomeric conductors of the prior art are generally difficult and expensive to manufacture. Particularly in the case of the elastomeric conductors having a plurality of conductive fibers, it is difficult to control the density of fibers at a particular location in the matrix, which problem is exacerbated when the density of the conductive fibers is very high. The use of such conductors in electronic assemblies has been limited by the high cost and low quality control of the conductors.

SUMMARY OF THE INVENTION

Novel electronic assemblies are fabricated from anisotropic elastomeric conductors which are easy to manufacture and can be tailored to a wide range of specifications. The electronic assemblies comprise alternating component layers and connecting layers, where the connecting layers are formed from the anisotropic elastomeric conductors. The component layers are rigid structures having at least one planar face with electrical contacts formed thereon, such as semiconductor devices, ceramic substrates, printed circuit boards, terminal strips, and the like.

The conductors comprise an elastomeric matrix having a plurality of parallel electrically conductive elements uniformly dispersed throughout. The conductors are relatively thin, and the electrically conductive elements extend across the thickness of the conductor so that they terminate on opposite faces thereof. In this way, the anisotropic elastomeric conductors are suited for interfacing between the component layers of the assembly and interconnecting the electrical contacts on adjacent component layers.

The anisotropic elastomeric conductors of the present invention may be fabricated from first and second sheet materials, where the first sheet material includes a plurality of electrically-conductive fibers (as the elements) positioned to lie parallel to one another and electrically isolated from one another. In the first exemplary embodiment, the first sheet comprises a wire cloth having metal fibers running in one direction which are loosely woven with insulating fibers running in the transverse direction. The second sheet consists of electrically-insulating fibers loosely woven in both directions. The first and second sheets are stacked on top of one another, typically in an alternating pattern, so that the second sheets provide insulation for the electrically-conductive fibers in the adjacent first sheets. After stacking a desired number of the first and second sheets, the layered structure is perfused with a liquid, curable elastomeric resin, such as a silicone rubber resin, to fill the interstices remaining in the layered structure of the loosely woven first and second sheets. Typically, pressure will be applied by well known transfer molding techniques, and the elastomer cured, typically by the application of heat. The resulting block structure will include the electrically-conductive fibers embedded in a solid matrix comprising two components, i.e., the insulating fibers and the elastomeric material.

The anisotropic elastomeric conductors of the present invention may also be fabricated from metal sheets or foil which are formed into a uniform pattern of parallel, spaced-apart conductors, typically by etching or stamping. The metal sheets are then coated with an elastomeric insulating material and stacked to form a block having the conductors electrically isolated from each other and running in a parallel direction. Usually, the coated metal sheets will be further separated by a sheet of an elastomer having a preselected thickness. In this way, the spacing or pitch between adjacent conductors can be carefully controlled in both the height and width directions of the block. After stacking a desired ndumber of the metal sheets and optionally the elastomeric sheets, the layered structure is cured by the application of heat and pressure to form a solid block having the conductors fixed in an insulating matrix composed of the elastomeric coating and, usually, the elastomeric sheets.

Slices will be cut from the block formed by either of these methods to a thickness suitable for the desired interface application. In the case of the layered fabric structure, if will often be desirable to dissolve at least a portion of the fibrous material in the matrix in order to introduce voids in the elastomeric conductor to enhance its compressibility.

BRIEF DESCRIPTION OF THE DRAWINGS

FIG. 1 illustrates the stacked first and second sheets of the first embodiment of the present invention prior to compression and transfer molding.

FIG. 2 is a detailed view of the first sheet material of the present invention.

FIG. 3 is a detailed view of the second sheet material of the present invention.

FIG. 4 illustrates the block of anisotropic elastomeric conductor material of the first embodiment of the present invention having a single slice removed therefrom.

FIG. 5 is a detailed view taken along line 5—5 in FIG. 4 and showing the placement of the electrically-conductive elements in the first embodiment of the present invention.

FIG. 6 is an exploded view illustrating the stacking procedure used to form the elastomeric conductor of the second embodiment of the present invention.

FIG. 7 is a cross-sectional view illustrating the layered structure of the second embodiment of the present invention.

FIG. 8 is a detailed view illustrating the final layered structure of the second embodiment of the present invention.

FIG. 9 is an exploded view illustrating an electronic assembly according to the present invention employing the anisotropic elastomeric conductor material as an interface between a semiconductor device having a planar array of connector pads and a device support substrate having a mating array of connector pads.

FIG. 10 is an exploded view illustrating an electronic assembly according to the present invention employing elastomeric conductor material as an interface between adjacent semiconductor support substrates.

FIG. 11 is an exploded view of an electronic assembly according to the present invention employing elastomeric conductor material as an interface between a terminal strip of a semiconductor module and a support substrate for the module.

FIG. 12 is an assembled view of the electronic assembly of FIG. 11, with portions broken away.

DESCRIPTION OF THE PREFERRED EMBODIMENTS

According to the present invention, electronic assemblies are formed from alternating component layers and connecting layers, where the component layers may be virtually any rigid structure having a one- or two-dimensional array of electrical contacts formed on a planar face thereof. Illustrative component layers include semiconductor devices; support substrates including ceramic substrates, plastic substrates, printed circuit boards, etc.; terminal strips; and the like. The connecting layers, which are formed from anisotropic elastomeric conductors, are interposed between electrical contact regions on adjacent component layers and serve to interconnect individual contacts which are aligned.

Anisotropic elastomeric conductors are fabricated from first and second sheets of loosely woven fabric material. The first sheet materials are made up of both electrically-conductive and electrically insulating fibers, where the electrically-conductive fibers are oriented parallel to one another so that no two fibers contact each other at any point. The electrically insulating fibers run generally transversely to the electrically conductive fibers in order to complete the weave. In some cases, it may be desirable to include electrically insulating fibers running parallel to the electrically-conductive fibers, either in addition to or in place of the electrically-conductive fibers, in order to adjust the density of conductive fibers in the final product. The second sheet material will be a loosely woven fabric comprising only electrically insulating fibers. The second sheet material is thus able to act as an insulating layer between adjacent first layers having electrically-conductive fibers therein.

Suitable electrically-conductive fibers include virtually any fiber material having a bulk resistivity below about 50 $\mu\Omega$-cm, more usually about 4 $\mu\Omega$-cm. Typically, the electrically-conductive fibers will be conductive metals, such as copper, aluminum, silver, and gold, and alloys thereof. Alternatively, suitable electrically conductive fibers can be prepared by modifying electrically insulating fibers, such as by introducing a conductivity-imparting agent to a natural or synthetic polymer, i.e., introducing metal particles. The preferred electrically-conductive fibers are copper, aluminum, silver, gold, and alloys thereof, usually copper wire.

The electrically insulating fibers in both the first and second sheet materials may be formed from a wide variety of materials, including natural fibers, such as cellulose, i.e., cotton; protein, i.e., wool and silk, and synthetic fibers. Suitable synthetic fibers include polyamides, polyesters, acrylics, polyolefins, nylon, rayon, acrylonitrile, and blends thereof. In general, the electrically insulating fibers will have bulk resistivities in the range from about $10^{11}$ to $10^{17}$ $\Omega$-cm, usually above about $10^{15}$ $\Omega$-cm.

The first and second sheet materials will be woven by conventional techniques from the individual fibers. The size and spacing of the fibers in the first sheet material will depend on the size and spacing of the electrical conductors required in the elastomeric conductor being produced. Typically, the electrically-conductive fibers will have a diameter in the range from about $10^{-3}$ to $10^{-2}$ cm. The spacing between adjacent conductors will typically be in the range from about $5 \times 10^{-3}$ to $5 \times 10^{-2}$ cm. The spacing of the insulating fibers in the first sheet material is less critical, but will typically be about the same as the spacing for the electrically conductive fibers. The fiber diameter of the electrically insulating fibers will be selected to provide a sufficiently strong weave to withstand the subsequent processing steps. In all cases, the weave will be sufficiently loose so that gaps or interstices remain between adjacent fibers so that liquid elastomeric resin may be introduced to a stack of the woven sheets, as will be described hereinafter.

Referring now to FIGS. 1–3, a plurality of first sheets 10 and second sheets 12 will be stacked in an alternating pattern. The dimensions of the sheets 10 and 12 are not critical, and will depend on the desired final dimensions of the elastomeric conductor product. Generally, the individual sheets 10 and 12 will have a length L between about 1 and 100 cm, more usually between about 10 and 50 cm. The width W of the sheets 10 and 12 will usually be between 1 and 100 cm, more usually between 10 and 50 cm. The sheets 10 and 12 will be stacked to a final height in the range from about 1 to 10 cm, more usually in the range from about 1 to 5 cm, corresponding to a total number of sheets in the range from about 25 to 500, more usually from about 25 to 200.

The first sheets 10 are formed from electrically-conductive fibers 14 woven with electrically insulating fibers 16, as illustrated in detail in FIG. 2. The first sheets 10 are oriented so that the electrically-conductive fibers 14 in each of the sheets are parallel to one another. The second sheet material is comprises of a weave of electrically insulating fiber 16, as illustrated in FIG. 3. In the case of both the first sheet material and the second sheet material, interstices 18 are formed between the individual fibers of the fabric. Depending on the size of the fibers 14 and 16, as well as on the spacing between the fibers, the dimensions of the interstices 18 may vary in the range from $10^{-3}$ to $10^{-2}$ cm.

In forming the stacks of the first and second sheet materials, it is possible to vary the pattern illustrated in FIG. 1 within certain limits. For example, it will be possible to place two or more of the second sheets 12 between adjacent first sheets 10 without departing from the concept of the present invention. In all cases, however, it will be necessary to have at least one of the second insulating sheets 12 between adjacent first conducting sheets 10. Additionally, it is not necessary that all of the first sheets 10 employed in a single stack can be identical, and two or more sheets 10 having different constructions may be employed. Similarly, it is not necessary that the second sheets 12 all be of identical construction, and a certain amount of variation is permitted.

In fabricating the materials of the present invention, it has been found convenient to employ commercially available sieve cloths which may be obtained from commercial suppliers. The second sheets may be nylon sieve cloths having a mesh ranging from about 80 to 325 mesh. The first sheet materials may be combined wire/nylon mesh cloths having a similar mesh sizing.

After the stack has been formed, as illustrated in FIG. 1, it is necessary to mold the stack into a solid block of elastomeric material. This may be accomplished by introducing a curable elastomeric resin into the interstices 18 of the layered sheet materials 10 and 12. Suitable elastomeric resins include thermosetting resins, such as silicon rubbers, urethane rubbers, latex rubbers, and the like. Particularly preferred are silicone rubbers because of their stability over a wide temperature range, their low compression set, high electrical insulation, low dielectric constant, and durability.

Perfusion of the elastomeric resin into the layered first and second sheets may be accomplished by conventional methods, typically by conventional transfer molding techniques. The layered structure of FIG. 1 is placed in an enclosed mold, referred to as a transfer mold. Fluidized elastomeric resin is introduced to the transfer mold, under pressure so that the mold cavity is completely filled with the resin. Either a cold or a heated mold may be employed. In the case of a cold mold, it is necessary to later apply heat to cure the resin resulting in a solidified composite block of the resin and the layered sheet materials. Such curing will take on the order of one hour. The use of heated mold reduces the curing time to the order of minutes.

Referring now to FIG. 4, the result of the transfer molding process is a solidified block 20 of the layered composite material. As illustrated, the individual conductors 14 are aligned in the axial direction in the block 20. To obtain relatively thin elastomeric conductors as will be useful in most applications, individual slices 22 may be cut from the block 20 by slicing in a direction perpendicular to the direction in which the conductors are running. This results in a thin slice of material having individual conductors uniformly dispersed throughout and extending across the thickness T of the slice 22 (as illustrated in detail in FIG. 5). As desired, the slice 22 may be further divided by cutting it into smaller pieces for particular applications. The thickness T is not critical, but usually will be in the range from about 0.02 to 0.4 cm.

The resulting thin section elastomeric conductor 22 will thus comprise a two-component matrix including both the insulating fiber material 16 and the elastomeric insulating material which was introduced by the transfer molding process. In some cases, it will be desirable to remove at least a portion of the insulating fiber material 16 in order to introduce voids in the conductor 22.

Such voids enhance the compressibility of the conductor, as may be beneficial under certain circumstances. The fibrous material may be dissolved by a variety of chemical means, typically employing oxidation reactions. The particular oxidation reaction will, of course, depend on the nature of the insulating fiber. In the case of nylon and most other fibers, exposure to a relatively strong mineral acid, such as hydrochloric acid, will generally suffice. After acid oxidation, the conductor material will of course be thoroughly washed before further preparation or use.

Referring now to FIGS. 6-8, an alternate method of fabricating the elastomeric conductors of the present invention will be described. The method utilizes a plurality of metal sheets 60 having a multiplicity of individual conductive elements 62 formed therein. The sheets 60 are formed from a conductive metal such as copper, aluminum, gold, silver, or alloys thereof, preferably copper, having a thickness in the range from about 0.1 to 10 mils, more usually about 0.5 to 3 mils. The conductive elements 62 are defined by forming elongate channels or voids 64 in the sheet 60, which voids provide for space between adjacent elements. The widths of the elements and of the voids will vary depending on the desired spacing of the conductive elements in the elastomeric conductor. Typically, the conductive elements 62 will have a width in the range from about 0.5 to 50 mils, more usually in the range from 2 to 20 mils, and the channels 64 will have a width in the range from 0.5 to 50 mils, more usually in the range from 5 to 20 mils.

The channels 64 may be formed in the sheets 60 by any suitable method, such as stamping or etching. Chemical etching is the preferred method for accurately forming the small dimensions described above. Conventional chemical etching techniques may be employed, typically photolithographic techniques where a photoresist mask is formed over the metal sheet and patterned by exposure to a specific wavelength of radiation.

In addition to forming channels 64 in the metal sheet 60, the etching step is used to form alignment holes 66. The alignment holes 66 are used to accurately stack the metal sheets 60, as will be described hereinafter.

Elastomeric sheets 70 are also employed in the alternate fabrication method of FIGS. 7-9. The sheets 70 may be composed of any curable elastomer, such as silicon rubber, and will usually have a thickness in the range from about 0.5 to 20 mils, more usually about 1 to 5 mils. The sheets 70 will also include alignment holes 72 to facilitate fabrication of the elastomeric conductors.

An elastomeric conductor block 80 (FIG. 8) may be conveniently assembled on an assembly board 82 (FIG. 7) having alignment pegs 84 arranged in a pattern corresponding to alignment holes 66 and 72 in sheets 60 and 70, respectively. The block 80 is formed by placing the elastomeric sheets 70 and metal sheets 60 alternately on the assembly board 82. The metal sheets 60 are coated with a liquid elastomeric resin, typically a liquid silicone rubber, which may be cured with the elastomeric sheets 70 to form a solid block. After a desired number of metal sheets 60 have been stacked, usually from 25 to 500, more usually from 100 to 300, the layered structure is cured by exposure to heat and pressure, as required by the particular resin utilized.

The resulting structure is illustrated in FIG. 8. The conductive elements 62 of sheets 60 are held in a continuous elastomeric matrix consisting of the elastomeric sheets 70 and layers 90 comprising the cured liquid elastomer coated onto the metal sheets 60. The liquid elastomer substantially fills the channels 64 between the conductive elements 62. The result is an elastomeric block 80 similar to the elastomeric block 20 of FIG. 4.

The elastomeric block 80 may also be sliced in a manner similar to that described for block 20, resulting in sheets 92, a portion of one being FIG. 9. Sheet 92 includes parallel opposed faces 94, with the conductive elements 62 running substantially perpendicularly to the faces.

Referring now to FIGS. 9-12, anisotropic elastomeric conductors fabricated as just described are used as connecting layers in forming an electrical interface between adjacent component layers in an electronic assembly. Referring in particular to FIG. 9, a semiconductor device 30 and a semiconductor support substrate 32 are illustrated. The semiconductor device 30 is of the type having a two-dimensional or planar array of electrical contact pads 34 on one face thereof. The support substrate 32, which is typically a multilayer connector board, usually a ceramic substrate, also includes a plurality of contact pads 36 arranged in a planar array. In general, the pattern in which the connector pads 34 are arranged on the semiconductor device 30 will correspond to that in which the contact pads 36 are arranged on the support substrate 32. The anisotropic elastomeric conductor 22 or 92 is placed between the device 30 and the substrate 32, and the device 30 and substrate 32 brought together in proper alignment so that corresponding pads 34 and 36 are arranged on directly opposite sides of the conductor 22 or 92. By applying a preselected contact pressure between the device 30 and substrate 32, firm electrical contact is made between the contact pads and the conductor 22 or 92. Usually, a sufficient number of electrically-conductive fibers are provided in the conductor 22 or 92 so that at least two fibers and preferably more than two fibers are intermediate each of the pairs of contact pads 34 and 36.

In FIG. 10, a plurality of conductor boards 100 are interconnected using connecting bars 102. Each connecting bar 102 comprises a frame 104 surrounding a core 106 of the elastomeric conductor 22 or 92 prepared as described above. Each conductor board includes contact regions 108 having multiple individual contacts 110 formed on the surface thereof. As illustrated, the contact regions 108 are rectangular and correspond to the peripheral dimensions of the connecting bars 102. The size and shape of both the contact regions and the connecting bars, however, may vary widely depending on the particular design criteria. The conductor boards may be the same or different, usually being multilayer ceramic or plastic substrates having a plurality of individual semiconductor devices 112 mounted on one or both surfaces. A variety of means may be employed for securing the conductor boards 100 together in a stack. As illustrated, bolts 114 are inserted through aligned holes 116 and 118 in the conductor board 100 and connector bar 102, respectively, and used to hold the stack together.

In FIGS. 11 and 12, the connecting layer of the present invention is used to secure a semiconductor module 120 to a conductor board 122, typically a multilayer ceramic substrate or a printed circuit board. The semiconductor module 120 includes contact pads 124 (FIG. 12) formed about its periphery. A terminal strip 126 is connected along one edge to the contact pads 124 on module 120, typically by soldering. The other edge of the terminal strip 126 is connected to contact region 130 on conductor board 122 using the connecting layer of the present invention. The connecting layer is defined by anisotropic resilient conductors formed into connecting strips 132. The connecting strips are sized to interface between the planar contact regions 130 and the planar contact regions 134 formed on the other edge of the terminal strip 126, connecting strips 132 and conductor board 122 are held together by opposed compression frames 140 and 142. The upper compression frame 140 is chamfered along its inner edge in order to accommodate the terminal strip 126 and to allow compression of the contact region 134 of the strip downward against the connecting strip 132 on the conductor board 122. The lower compression frame 140 is provided to receive connecting bolts 144 (FIG. 12) and evenly distribute stress on the conductor board 122.

Although the foregoing invention has been described in some detail by way of illustration and example for purposes by clarity of understanding, it will be obvious that certain changes and modifications may be practiced without the scope of the appended claims.

What is claimed is:

1. An electronic assembly comprising alternating component layers and connecting layers, said component layers being rigid structures having at least one planar face with electrical contacts formed thereon and said connecting layers being anisotropic elastomeric conductors positioned between opposed electrical contacts on adjacent component layers, wherein said anisotropic elastomeric conductors are formed by a method comprising:
    forming a stack of first and second sheets so that at least one second sheet lies between adjacent first sheets, wherein said first sheets are metal sheets, each metal sheet forming a plurality of electrical conductive elements, said electrically conductive elements running in one direction only, and said second sheets are composed of electrically insulating material;
    introducing a curable elastomeric resin to the stack;
    curing the elastomeric resin to form a solid matrix having the electrically conductive elements electrically isolated from one another and extending from one side of the block to the opposite side; and
    slicing the matrix in a direction transverse to the direction of the electrically conductive elements to yield said anisotropic elastomeric conductors having the elements extending thereacross.

2. An assembly as in claim 1, wherein at least some of the component layers are semiconductor devices.

3. An assembly as in claim 1, wherein at least some of the component layers are ceramic substrates.

4. An assembly as in claim 1, wherein at least some of the component layers are printed circuit boards.

5. A assembly as in claim 1, wherein at least some of the component layers are terminal strips.

6. An assembly as in claim 1, wherein said component layers include a plurality of printed circuit boards each carrying a multiplicity of semiconductor devices and having contact regions formed on both faces, said board being stacked with the conductors interposed between adjacent contact regions.

7. An assembly as in claim 1, wherein the resin is introduced to the stack by coating the first sheets with said resin.

8. An assembly as in claim 1 wherein the maximum width of said electrically conductive elements is 0.005 inches.

9. An assembly as in claim 1, wherein the second sheets are continuous elastomeric sheets.

10. An assembly as in claim 9, wherein the elastomeric resin and the elastomeric sheets are silicone rubber.

11. An assembly as in claim 1 wherein said electrical conductive elements on said first sheets are defined by forming channels therebetween on said first sheets prior to stacking said first and second sheets, and said curable elastomeric resin is introduced into said stack so that it fills said channels between said electrically conductive elements.

12. An assembly as in claim 1 wherein the maximum thickness of said first sheets is 0.003 inches.

13. An assembly as in claim 12 wherein the maximum width of said electrically conductive elements is 0.005 inches.

* * * * *